(12) United States Patent
Heath et al.

(10) Patent No.: US 10,270,393 B1
(45) Date of Patent: Apr. 23, 2019

(54) TRANSCONDUCTANCE AMPLIFIER WITH NONLINEAR TRANSCONDUCTANCE AND LOW QUIESCENT CURRENT

(71) Applicant: Linear Technology Holding LLC, Norwood, MA (US)

(72) Inventors: Jeffrey Lynn Heath, Santa Barbara, CA (US); Trevor Wayne Barcelo, Andover, MA (US)

(73) Assignee: Linear Technology Holding LLC, Norwood, MA (US)

( * ) Notice: Subject to any disclaimer, the term of this patent is extended or adjusted under 35 U.S.C. 154(b) by 0 days.

(21) Appl. No.: 15/928,791

(22) Filed: Mar. 22, 2018

(51) Int. Cl.
*H03F 1/02* (2006.01)
*H03F 3/45* (2006.01)

(52) U.S. Cl.
CPC ....... *H03F 1/0205* (2013.01); *H03F 3/45179* (2013.01); *H03F 2203/45288* (2013.01)

(58) Field of Classification Search
CPC .................................................. H03F 1/0205
See application file for complete search history.

(56) References Cited

U.S. PATENT DOCUMENTS

| | | | |
|---|---|---|---|
| 2002/0149423 A1* | 10/2002 | Prentice | H03F 1/3211 330/85 |
| 2009/0009249 A1* | 1/2009 | Gilbert | H03G 1/0035 330/260 |
| 2015/0061769 A1* | 3/2015 | Bodnar | H03G 3/3042 330/282 |
| 2016/0291631 A1* | 10/2016 | Sen | H02M 3/158 |
| 2017/0264252 A1* | 9/2017 | Day | H03F 1/3211 |
| 2018/0254745 A1* | 9/2018 | Kovac | H03F 1/0222 |

* cited by examiner

*Primary Examiner* — Patricia T Nguyen
(74) *Attorney, Agent, or Firm* — Patent Law Group LLP; Brian D. Ogonowsky (57) ABSTRACT

A composite transconductance amplifier is formed using a single transconductance amplifier with its output connected to a load via one or more resistors in series. The single transconductance amplifier has a linear transconductance (gm). As the current through the series resistors is increased, the voltage drops across the nodes of the resistors increase. Control terminals of separate drive circuits are connected to the various nodes and successively turn on as the current from the single transconductance amplifier slews more positive. Thus, the effective gm of the composite transconductance amplifier is based on the gm of the single transconductance amplifier and the currents contributed by the successively enabled drive circuits. Therefore, the gm is nonlinear. Pull-down drive circuits are also connected to the resistor nodes to successively pull down the current as the output from the single transconductance amplifier slews negative. The composite transconductance amplifier has low quiescent current.

20 Claims, 6 Drawing Sheets

TRANSCONDUCTANCE AMPLIFIER WITH NONLINEAR TRANSCONDUCTANCE AND LOW QUIESCENT CURRENT

FIELD OF THE INVENTION

This invention relates to transconductance amplifiers and, more particularly, to a transconductance amplifier having a selectable nonlinear transconductance (gm) while drawing a low quiescent current.

BACKGROUND

A transconductance amplifier receives an input voltage and outputs a current having some defined relationship to the input voltage. The transconductance (gm) of the amplifier is typically constant for a wide range of input voltages, but a nonlinear transconductance is desirable for some applications. The transconductance is given as gm=$\Delta$Iout/$\Delta$Vin and may be variable for different ranges of $\Delta$Vin.

The output of a transconductance amplifier may be used to charge and discharge a capacitor, control a MOSFET or bipolar transistor, or used for other purposes. Rapidly charging/discharging high capacitance loads, or driving large MOSFETs, may require a transconductance amplifier with a higher gm.

One example of the usefulness of a transconductance amplifier having a nonlinear gm is in a feedback circuit such as used in a voltage regulator. The amplifier may receive a reference voltage and the regulator's divided output voltage. If the two voltages match (during steady state operation), the current output of the amplifier is substantially zero and the output voltage of the regulator is not changed. When the divided output voltage of the regulator becomes greater than or less than the reference voltage, such as due to a change in the load, the non-zero output current from the amplifier causes the output voltage of the regulator to go down or up to again match the divided output voltage to the reference voltage. Since there are transient signals and delays involved in the operation of such a feedback circuit, stability is a concern. By the amplifier having a low gm for small input voltage differences, the regulator has added stability and, by the amplifier having a high gm for large input voltage differences, the regulator can quickly react to changing loads.

Such nonlinear gm transconductance amplifiers have many other uses.

The gm can be asymmetric, such as where a positive voltage differential causes the amplifier to have a particular gm and where a negative voltage differential causes the amplifier to have a different gm. Such an asymmetric gm may be where the amplifier is driving a device to emulate a diode.

Figure 1:
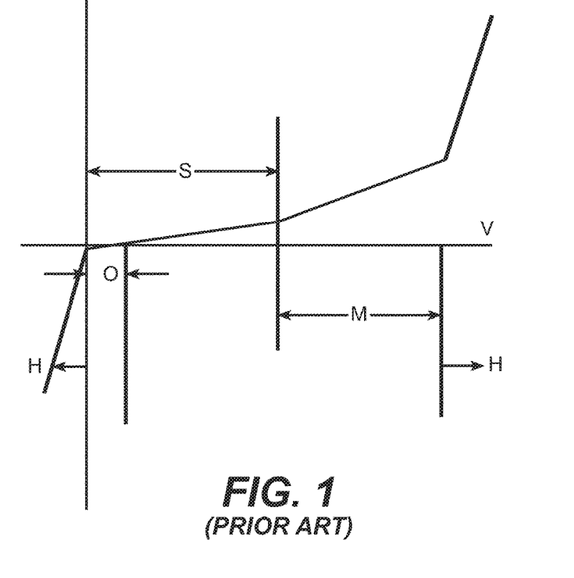
FIG. 1 is a possible current vs. voltage waveform of a transconductance amplifier having an asymmetric nonlinear transconductance (gm).

FIG. 1 illustrates the current output of a transconductance amplifier having stepped gms and an asymmetric output. When there is a negative voltage differential at the amplifier's input, the amplifier has a high gm, labeled H. The input may have an offset voltage, causing the amplifier to output substantially zero current during the offset range, labeled O. For a small positive voltage differential above the offset, the amplifier is configured to have a small gm, labeled S. For a larger positive voltage differential, the amplifier is configured to have a medium gm, labeled M. For an even larger positive voltage differential, the amplifier is configured to have a high gm, labeled H.

Multiple transconductance amplifiers may be interconnected to achieve the desired characteristics of FIG. 1.

Figure 2:
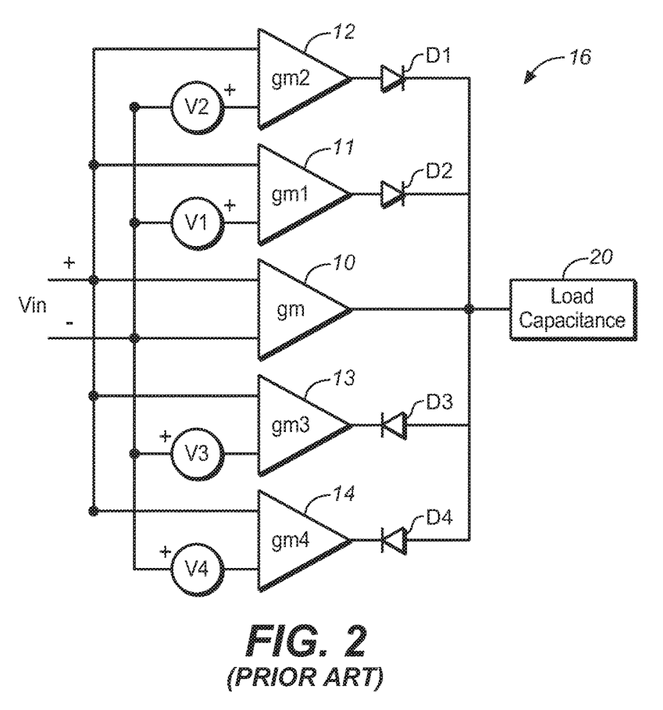
FIG. 2 illustrates one example of a prior art composite transconductance amplifier composed of a plurality of individual transconductance amplifiers and voltage source offsets.
Figure 3:
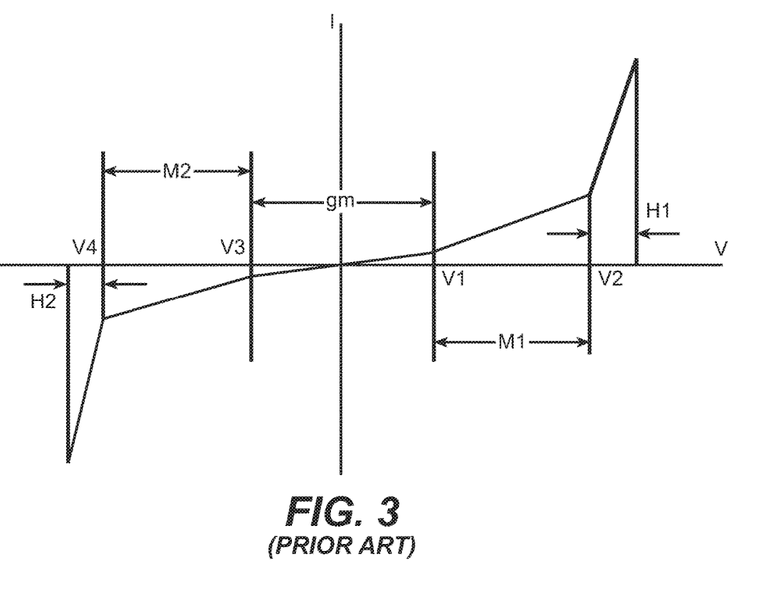
FIG. 3 is a possible current vs. voltage waveform of the nonlinear transconductance amplifier of FIG. 2, illustrating a symmetrical nonlinear gm.

FIG. 2 illustrates one prior art technique for varying gms of a composite transconductance amplifier, and FIG. 3 is a current vs. voltage curve obtained by the amplifier of FIG. 2.

The individual transconductance amplifiers are labeled as 10, 11, 12, 13, and 14 and have respective transconductances of gm, gm1, gm2, gm3, and gm4. The gms may be the same or different. The amplifiers 10-14 operate in different combinations to perform as a single transconductance amplifier 16 having tailored characteristics. Different voltage offsets V1-V4 are shown coupled to the inverting inputs of the amplifiers. The polarities of the voltage offsets are identified. The diodes D1-D4 are not part of the circuit but just convey the different directions of current output by the amplifiers 10-14. The composite amplifier 16 is shown driving a capacitive load 20.

FIG. 3 shows the current vs. input voltage waveform for the amplifier 16 of FIG. 2 as the input voltage Vin is swept from a negative voltage to a positive voltage. The waveform is symmetric about zero volts. The offset voltage levels are identified as V1-V4. The offset voltages determine when each amplifier 11-14 contributes to the output current. The amplifier 10 is always contributing to the output current and operates through the full voltage range. The amplifier 11 contributes current when a positive input voltage differential exceeds V1, and its gm is combined with that of the amplifier 10, shown as the medium gm M1 in FIG. 3. The amplifier 12 contributes current when the positive input voltage differential exceeds V2, and its gm is combined with that of the amplifiers 10 and 11, shown as the high gm H1. For a negative input voltage, the amplifier 13 contributes current when the negative input voltage differential exceeds V3, and its gm is combined with that of the amplifier 10, shown as the medium gm M2. The amplifier 14 contributes current when the negative input voltage differential exceeds V4, and its gm is combined with that of the amplifiers 10 and 13, shown as the high gm H2. The composite amplifier 16 could have had an asymmetric output by changing the gms of the individual amplifiers or the offsets.

Drawbacks with the design of FIG. 2 include the gms having discrete levels and each individual amplifier always drawing a quiescent current. More amplifiers can be added to increase the gm levels but this adds to the quiescent current, complexity, and cost.

What is needed is an improved transconductance amplifier with a nonlinear gm, where the quiescent current of the amplifier is much lower than that of the prior art design.

SUMMARY

In its simplest embodiment, a single transconductance amplifier with a fixed gm is coupled to a load, such as a capacitive load, via a resistor. The current output by the amplifier creates a voltage drop across the resistor. An NPN bipolar transistor has its base coupled to one end of the resistor and its emitter coupled to the other end of the resistor. Similarly, a PNP bipolar transistor has its base coupled to one end of the resistor and its emitter coupled to the other end of the resistor. The NPN transistor is progressively turned on by a positive current from the amplifier as the voltage across the resistor exceeds the positive base-emitter voltage necessary for turning on the NPN transistor (e.g., 0.7 V). Similarly, the PNP transistor is progressively turned on by a negative current from the amplifier as the voltage across the resistor exceeds the negative base-emitter voltage necessary for turning on the PNP transistor (e.g., −0.7 V). Thus, the gm of the amplifier is boosted for both positive and negative currents after an offset that is determined by the value of the resistor. Therefore, the circuit can be designed, or settable by the user, to have a small gm within any range of a zero voltage input, and a much larger gm outside of that range. The gm can be asymmetric by the selection of NPN and PNP transistors, or by using voltage offsets, or by using transistors in parallel. Further, since the currents supplied by the NPN and PNP transistors smoothly ramp up after the voltage drop across the resistor reaches the associated thresholds, the gm variation is continuous and not discrete. Therefore, the quiescent current is just that of a single transconductance amplifier at the lowest gm, where the circuit may operate at for a majority of the time. The range of gms may be made very high with no added quiescent current required.

In a more complex embodiment, multiple resistors are connected in series between the transconductance amplifier and the load to create a resistor divider having taps. Various drive circuits are connected to the different taps so as to be enabled at different current level outputs of the transconductance amplifier. Each drive circuit may produce a different current to make the combined output current into the load exponential or any other non-linear function of the input voltage. The drive circuits draw no current until enabled.

If the transconductance amplifier is used in a feedback loop, such as in a regulator which matches its output voltage to a reference, it is relatively easy to compensate (for improving stability) due to its low gm when the inputs are balanced (in steady state). The transconductance amplifier has a high gm only when slewing.

Such a transconductance amplifier is also particularly suited for driving high capacitance loads, including large MOSFETs, and for allowing customization of the gm for different capacitive loads. Other uses include driving devices to emulate diodes.

Various other embodiments are described.

BRIEF DESCRIPTION OF THE DRAWINGS

Elements that are the same or equivalent are labeled with the same numeral.

DETAILED DESCRIPTION

Figure 4:
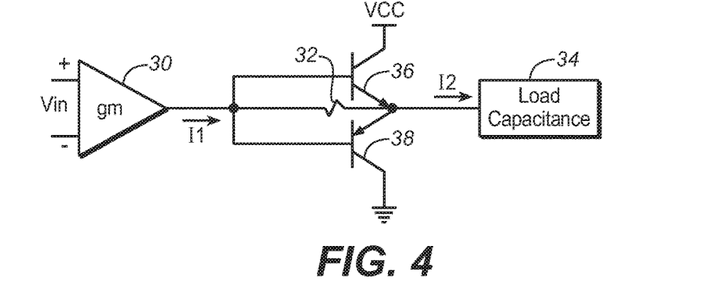
FIG. 4 illustrates one embodiment of the invention, where a single transconductance amplifier is used to provide a symmetric or asymmetric nonlinear gm, so quiescent current is low.

FIG. 4 illustrates one embodiment of the invention. The transconductance amplifier 30 may be any conventional transconductance amplifier that has a fixed transconductance (gm) within a certain range of input voltages. The output current I1 of the amplifier 30 is controlled by the input voltage Vin applied to its inverting and non-inverting input terminals. This current I1 generates a voltage drop across a resistor 32 in series between the amplifier 30 and a load 34, which is represented by a load capacitance, but may be any type of load. The load 34 may be a capacitor in a voltage regulator feedback network, a MOSFET, or any other type of load where a nonlinear gm may be beneficial.

A bipolar NPN transistor 36 has its base coupled to one end of the resistor 32 and its emitter coupled to the other end of the resistor 32. Similarly, a bipolar PNP transistor 38 has its base coupled to one end of the resistor 32 and its emitter coupled to the other end of the resistor 32. The base currents are assumed to be negligible in the example.

Assuming the current is a positive current (Vin is positive), the NPN transistor 36 will not turn on until the voltage drop across the resistor 32 exceeds the base-emitter turn-on voltage (Vbe) of the NPN transistor 36, which may be about 0.7V. Other types of transistors may be used. Therefore, for low currents output by the amplifier 30, the NPN transistor 36 does not add current to the load 34 so the overall gm of the circuit is relatively low (that of the transconductance amplifier 30). As the current I1 is increased due to an increase in Vin, the NPN transistor 36 turns on and contributes current into the load 34. The combined currents are shown as I2. The value of the resistor 32 is selected to determine the I1 threshold current needed to begin turning on the NPN transistor 36. Since the pull-up current provided by the NPN transistor 36 smoothly increases as the current I1 exceeds the threshold current, there will be no discontinuities in the gm.

Similarly, the PNP transistor 38 is progressively turned on by a negative current from the amplifier 30 as the voltage across the resistor 32 exceeds the negative base-emitter voltage necessary for turning on the PNP transistor 38 (e.g., −0.7 V). The PNP transistor 38 then contributes pull-down current to the negative current I1.

Thus, the gm of the amplifier is smoothly boosted for both positive and negative currents after an offset that is determined by the value of the resistor. Therefore, the circuit can be designed, or settable by the user, to have a small gm within any range of a zero differential voltage input and a much larger gm outside of that range. The increased gm is exponential.

Since only a single transconductance amplifier 30 is used, the quiescent current for the circuit of FIG. 4 is equal to the quiescent current of a single transconductance amplifier, in contrast to the quiescent current of the circuit of FIG. 2. The range of gms may be made very high with no added quiescent current required and no further circuitry needed.

If the circuit of FIG. 4 was used in a feedback network, the feedback loop would not be affected by the bipolar transistors during steady state conditions, so the gm of the transconductance amplifier would be easy to compensate to achieve the desired stability.

If high gms were desired, requiring added base current into the bipolar transistors, a multi-stage Darlington circuit can be used to boost the base current. If MOSFETs were used instead of bipolar transistors, the need for base drive is eliminated, but the gate capacitance may limit the slew capability of the system.

Figure 5:
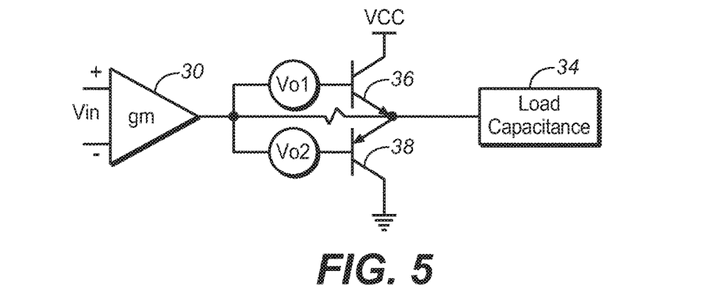
FIG. 5 illustrates another embodiment of the invention, where a single transconductance amplifier is used to provide a symmetric or asymmetric nonlinear gm, so quiescent current is low, where the circuit provides a low gm at low differential voltages and a much higher gm outside of that range.

FIG. 5 illustrates an added feature of a selectable offset for the NPN transistor 36 and the PNP transistor 38 so that the transistors can be turned on at different current levels to achieve a tailored asymmetry of the I vs. V waveform. For example, the voltage source offset of Vo1 may subtract or add voltage to the base of the NPN transistor 36 to cause it to turn on at a selected current I1 output from the transconductance amplifier 30. Similarly, the voltage source offset of Vo2 may subtract or add voltage to the base of the PNP transistor 38 to cause it to turn on at a selected current I1 output from the transconductance amplifier 30.

Figure 6:
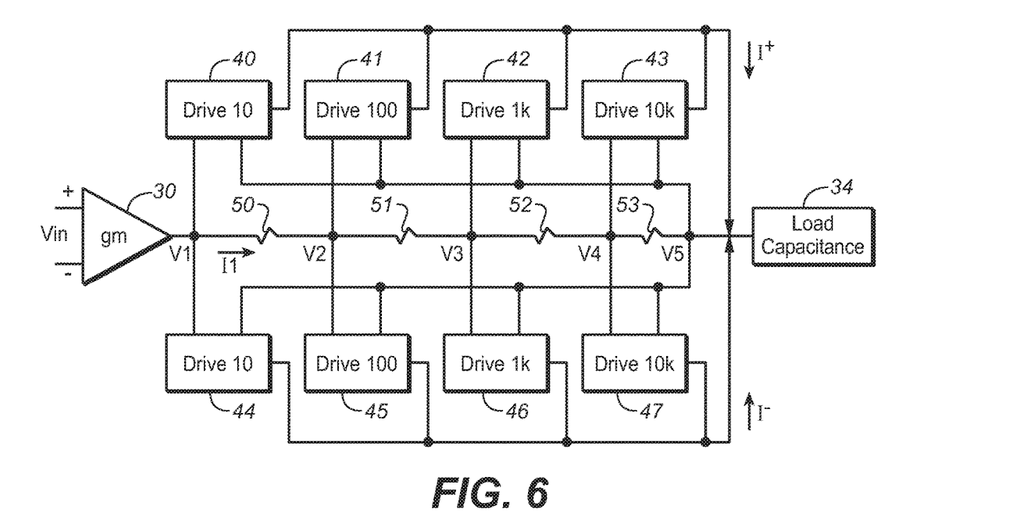
FIG. 6 illustrates another embodiment of the invention, where a single transconductance amplifier is used to provide a symmetric or asymmetric nonlinear gm, so quiescent current is low, where tapped voltages selectively enable drive circuits depending on the current output of the transconductance amplifier.

FIG. 6 illustrates another embodiment of the invention, where a single transconductance amplifier 30 is used to provide a symmetric or asymmetric nonlinear gm, where tapped voltages selectively enable pull-up and pull-down drive stages 40-47 depending on the current output of the transconductance amplifier 30. The drive stages 40-47 do not use any quiescent current until enabled, so the quiescent current is low during low gm operation. Each drive stage 40-47 may comprise a voltage detector, for detecting an enabling voltage, and a current source. The current source may be a MOSFET connected between the load 34 and the positive or negative rail voltage. The drive stages 40-47 are identified as Drive 10, 100, 1 k, and 10 k, meaning that the drive stage has a pull-up or pull-down capability of 10, 100, 1 k, or 10 k times that of the pull-up or pull-down capability of the amplifier 30. This capability may directly correlate to the relative sizes of MOSFETs used as the pull-up or pull-down devices. These scale factors are arbitrary and may be customized for a particular application.

A series of resistors 50-53 conduct the current I1 from the transconductance amplifier 30 to the load 34, so there are different voltage drops at the nodes of the resistors. These voltages are tapped by the drive stages 40-47 and are used to enable different combinations of the drive stages 40-47 as the current I1 ramps positively or negatively. The different drive stages 40-47 have a pair of enable pins coupled to the taps and are enabled at different current levels output by the transconductance amplifier 30. One enable pin on all drive stages 40-47 is connected to voltage V5 as the reference voltage. The other enable pin is connected to one of the taps. The resistor values may be the same or different.

In the example, the currents delivered by the drive stages 40-47 are exponentially scaled, but the drive stages 40-47 can be scaled in any manner.

In operation, at a very low current, no tapped voltage is sufficient to enable any drive stage 40-47, so the gm is only that of the transconductance amplifier 30. Upon a positive current reaching a first threshold level, where the voltage drop between V1 and V5 equals the enable voltage (e.g., 1V) of the pull-up drive stage 40, the drive stage 40 adds a fixed positive current to the current into the load 34. As the current from the transconductance amplifier 30 is increased, the voltage drop between V2 and V5 equals the enable voltage (e.g., 1V) of the pull-up drive stage 41, and the drive stage 41 adds its fixed positive current to the current into the load 34. The process continues as the current from the transconductance amplifier 30 is further increased. As seen the positive current is exponentially (nonlinearly) increased as Vin is increased due to the additional drive stages being successively enabled.

For negative input voltages Vin, the enable pin connections of the pull-down drive stages 44-47 are reversed so that the reference voltage V5 becomes positive relative to the other taps. The pull-down drive stages 44-47 are successively enabled as the current output by the transconductance amplifier 30 becomes more and more negative. The current supplied to the load 34 is exponential and symmetric. The gm may be asymmetric by selecting different drive stages. Any number of drive stages can be used to smooth out the transitions.

Since the drive stages 40-47 do not draw current before they are enabled, they do not add to the quiescent current.

Each drive stage 40-47 may include a selectable offset for its enablement to further customize the I vs. V waveform.

If the circuit of FIG. 6 was used in a feedback loop, at steady state conditions, only the transconductance amplifier 30 gm is relevant, so compensation for stability is easily implemented.

Further, since only one transconductance amplifier is connected to the input voltage, the input voltage source sees a low input capacitance, so reaction time is rapid.

The added drive stages 40-47 can slew a capacitive load (including a large MOSFET) very quickly, especially if they are exponentially weighted.

With capacitive loads, and where the current into the load is detected and controlled by a feedback loop, the turning on of the various drive stages 40-47 is not directly controlled by the input voltage Vin, but by the current slew rate through the series resistors.

Figure 7:
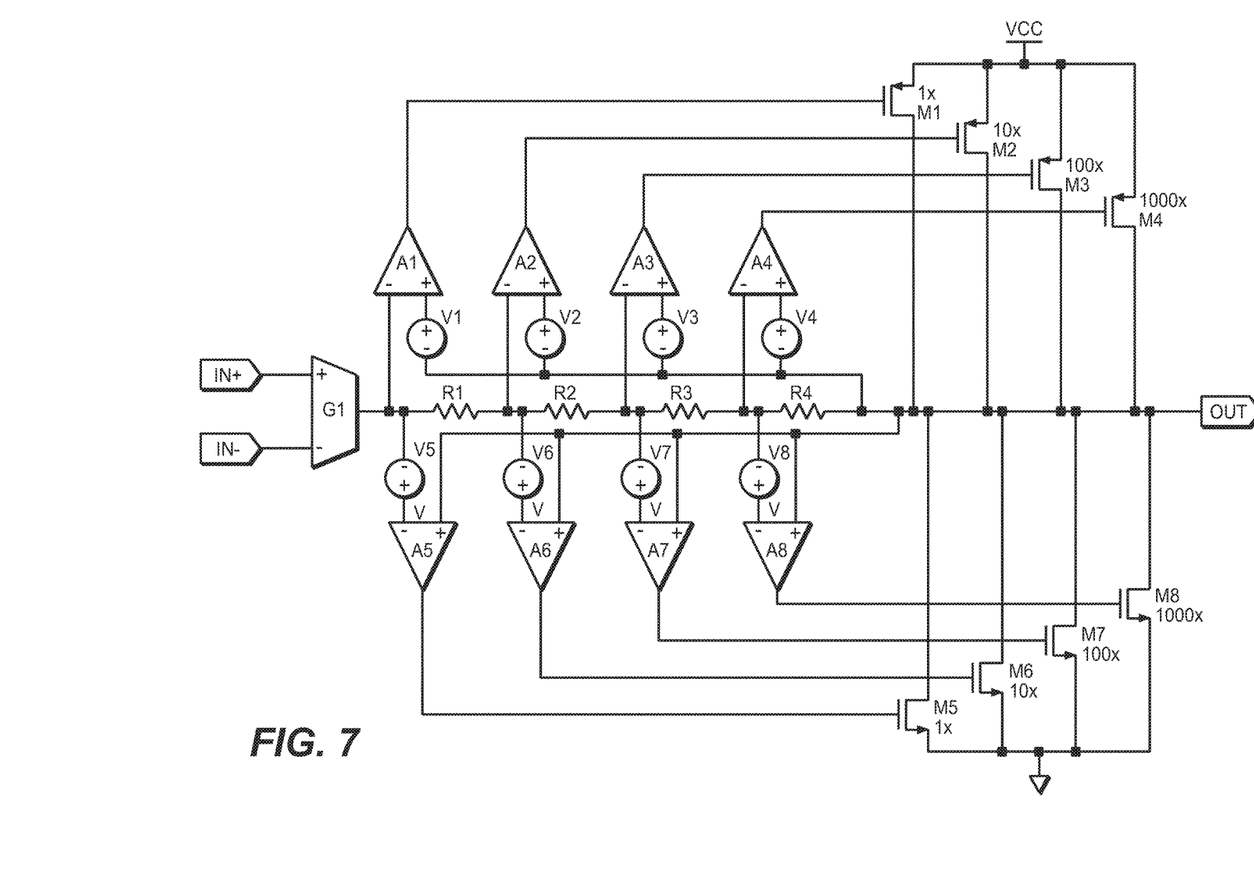
FIG. 7 is a more detailed schematic of the transconductance amplifier of FIG. 6.

FIG. 7 illustrates a circuit similar to FIG. 6, showing MOSFETs M1-M8 as the pull-up and pull-down current sources, and a driver A1-A8 for each MOSFET coupled to the resistor taps. Resistors R1-R4 are shown in series between the transconductance amplifier G1 and the output terminal OUT, for coupling to a load (not shown). Each driver A1-A8 has an optional voltage source offset V1-V8 that is used to further control when each MOSFET M1-M8 turns on as the current generated by the transconductance amplifier G1 ramps up or down. MOSFETs M1-M4 are P-channel MOSFETs and MOSFETs M5-M8 are N-channel MOSFETs. Varying the voltage source offsets enables an asymmetric gm. The relative sizes of the MOSFETs M1-M8 are shown so that the variations in current supplied to the load are exponential.

Figure 8:
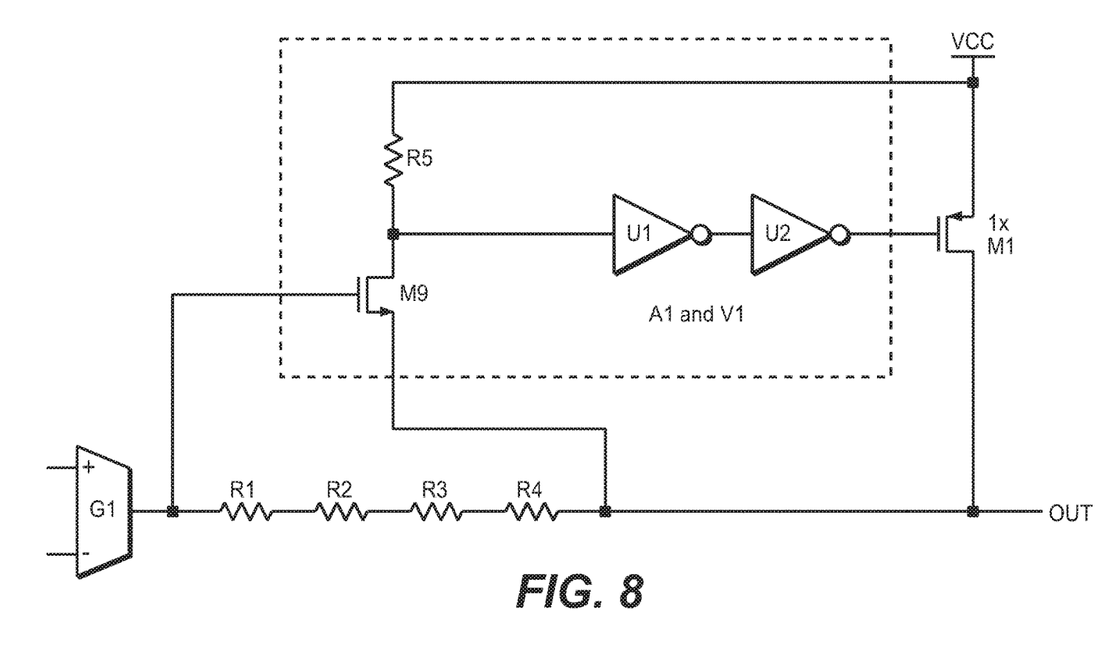
FIG. 8 is a more detailed schematic of a selectable pull-up drive circuit in the circuit of FIG. 6.

FIG. 8 illustrates a circuit that may be used for each pull-up driver A1-A4 and its voltage offset. The particular configuration is for the driver A1 having inputs connected between resistors R1 and R4. The MOSFET M9 senses the differential voltage across resistors R1-R4. When the voltage reaches the threshold voltage of the MOSFET M9, current flows through resistor R5 to create a sufficient voltage drop to pull down the input of the inverter U1, which pulls up on the input to the inverter U2, which then pulls down on the input of the P-channel MOSFET M1 to turn it on. In other words, when enough differential input voltage is applied to the transconductance amplifier G1 such that the current flowing through resistors R1-R4 drops a threshold voltage (Vt), then MOSFET M9 turns on and triggers inverters U1 and U2 to turn on MOSFET M1. A capacitor can be added across the resistor R5 to provide noise filtering or delay. Additional inverters may be used to increase the drive strength.

The circuit has relatively low capacitance since MOSFET M9 can be small. No quiescent current is drawn until the threshold is reached.

The pull-down drivers A4-A8 may simply be "upside down" versions of the pull-up driver of FIG. 8, with the types of MOSFET being opposite polarity.

Figure 9:
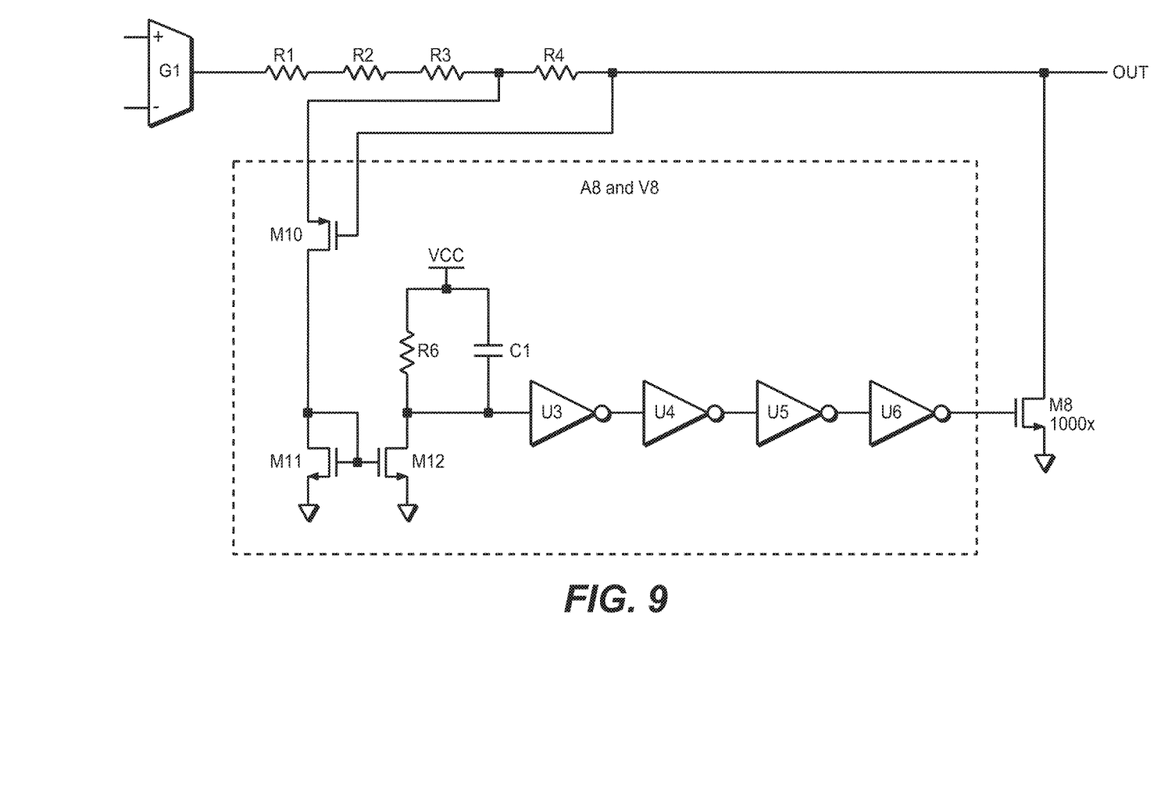
FIG. 9 is a more detailed schematic of a selectable pull-down drive circuit in the circuit of FIG. 6.

FIG. 9 illustrates one of the pull-down drivers A4-A8 with additional features, and the particular configuration is for the driver A8. The additional inverters U3-U8 increase the drive current for the larger MOSFET M8. The input senses the voltage across only resistor R4. The capacitor C1 across the resistor R6 serves as a noise filter or to provide delay. The current mirror MOSFETs M11 and M12 show how level-shifting or analog gm can be added. By changing the size ratios of the MOSFETs M11 and M12, the sensitivity can be adjusted. The circuit of FIG. 9 presents very low capacitive loading to the transconductance amplifier G1 and consumes no quiescent current until the threshold of MOSFET M10 is reached. All the various pull-up and pull-down circuits may be generally referred to as drive circuits, since they may consist of simple bipolar transistors (FIGS. 4 and 5) or may include voltage detectors or other enablement circuits in addition to the pull-up or pull-down current sources.

All the circuits shown may be formed as integrated circuits.

Many other circuit configurations may be used to carry out the inventive techniques.

While particular embodiments of the present invention have been shown and described, it will be obvious to those skilled in the art that changes and modifications may be made without departing from this invention in its broader aspects and, therefore, the appended claims are to encompass within their scope all such changes and modifications that are within the true spirit and scope of this invention.

What is claimed is:

1. A transconductance amplifier circuit for generating a nonlinear current comprising:
    a first amplifier having input terminals for receiving an input voltage, the first amplifier configured to output a first current to a load, the first current having a substantially linear relationship to the input voltage within a first range so as to have a substantially linear transconductance (gm) over the first range;
    at least a first resistance connected in series between the first amplifier and the load, wherein the first current generated by the first amplifier causes a voltage drop across the first resistor; and
    a first drive circuit having terminals coupled across the first resistance, wherein the first drive circuit is configured to add a second current to the first current, to supply a first composite current to the load, when the voltage drop across the first resistance exceeds a first threshold, such that a transconductance with respect to the input voltage and the first composite current is nonlinear.

2. The circuit of claim 1 further comprising a second drive circuit having terminals coupled across the first resistance, wherein the second drive circuit adds a third current to the first current, to supply a second composite current to the load, when the voltage drop across the first resistance exceeds a second threshold, such that the transconductance with respect to the input voltage and the second composite current is nonlinear.

3. The circuit of claim 2 wherein the first threshold is exceeded when a positive current through the first resistance exceeds a first level, and wherein the second threshold is exceeded when a negative current through the first resistance exceeds a second level.

4. The circuit of claim 2 wherein the first drive circuit comprises a bipolar NPN transistor having its base coupled to a first end of the first resistance and its emitter coupled to a second end of the first resistance, and wherein the second drive circuit comprises a bipolar PNP transistor having its base coupled to the first end of the first resistance and its emitter coupled to the second end of the first resistance.

5. The circuit of claim 1 wherein the first drive circuit comprises a bipolar NPN transistor having its base coupled to a first end of the first resistance and its emitter coupled to a second end of the first resistance.

6. The circuit of claim 1 wherein the first resistance comprises one of a plurality of resistors in series between the first amplifier and the load, wherein nodes between the resistors provide different voltage taps as the first current is conducted by the plurality of resistors, the circuit further comprising:
    a plurality of first additional drive circuits having terminals coupled to the different voltage taps, wherein different combinations of the first drive circuit and the first additional drive circuits are enabled as the voltages at the voltage taps are increased as the first current goes more positive.

7. The circuit of claim 6 wherein the terminals of the plurality of first additional drive circuits and the terminals of the first drive circuit are enable terminals, wherein each of the drive circuits are enabled when a voltage across its enable terminals exceeds an enable threshold.

8. The circuit of claim 6 wherein currents supplied by the first drive circuit and the first additional drive circuits are weighted.

9. The circuit of claim 8 wherein currents supplied by the first drive circuit and the first additional drive circuits are exponentially weighted.

10. The circuit of claim 6 further comprising:
    a plurality of second additional drive circuits having terminals coupled to the different voltage taps, wherein different combinations of the second additional drive circuits are enabled as the voltages at the voltage taps are decreased as the first current goes more negative.

11. The circuit of claim 10 wherein each of the first additional drive circuits comprises a first driver having input terminals coupled to two of the voltage taps, and wherein an output of the first driver drives a pull-up transistor, and
    wherein each of the second additional drive circuits comprises a second driver having input terminals coupled to two of the voltage taps, and wherein an output of the second driver drives a pull-down transistor.

12. The circuit of claim 6 wherein each of the first additional drive circuits comprises a first driver having input terminals coupled to two of the voltage taps, and wherein an output of the first driver drives a pull-up transistor.

13. The circuit of claim 12 wherein a voltage offset is coupled to one of the input terminals of the first driver.

14. The circuit of claim 12 wherein the transconductance with respect to the input voltage and the first composite current is nonlinear and asymmetrical.

15. The circuit of claim 6 wherein the first additional drive circuits are enabled sequentially as the first current is increased.

16. The circuit of claim 1 further comprising a voltage offset coupled to one of the terminals of the first drive circuit.

17. The circuit of claim 1 wherein the first drive circuit consumes no current until the first drive circuit generates the second current.

18. A method performed by a transconductance amplifier circuit generating a nonlinear current comprising:
- generating a first current by a first amplifier having input terminals for receiving an input voltage, the first current having a substantially linear relationship to the input voltage within a first range so as to have a substantially linear transconductance (gm) over the first range;
- dropping a voltage across at least a first resistance connected in series between the first amplifier and a load, due to the first current flowing through the first resistance; and
- adding a second current to the first current, by a first drive circuit having terminals coupled across the first resistance, to supply a first composite current to the load, when the voltage drop across the first resistance exceeds a first threshold, such that a transconductance with respect to the input voltage and the first composite current is nonlinear.

19. The method of claim 18 further comprising:
- adding a third current to the first current by a second drive circuit having terminals coupled across the first resistance, to supply a second composite current to the load, when the voltage drop across the first resistance exceeds a second threshold, such that the transconductance with respect to the input voltage and the second composite current is nonlinear.

20. The method of claim 19 wherein the first threshold is exceeded when a positive current through the first resistance exceeds a first level, and wherein the second threshold is exceeded when a negative current through the first resistance exceeds a second level.

* * * * *